(12) United States Patent
Millar et al.

(10) Patent No.: US 7,737,740 B2
(45) Date of Patent: Jun. 15, 2010

(54) INTEGRATED CIRCUIT WITH A PROGRAMMABLE DELAY AND A METHOD THEREOF

(75) Inventors: Brian M. Millar, Austin, TX (US); Andrew P. Hoover, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 144 days.

(21) Appl. No.: 11/740,697

(22) Filed: Apr. 26, 2007

(65) Prior Publication Data

US 2008/0265966 A1 Oct. 30, 2008

(51) Int. Cl.
*H03L 7/00* (2006.01)
(52) U.S. Cl. .................... 327/141; 327/161
(58) Field of Classification Search .......... 327/143, 327/261, 161, 544
See application file for complete search history.

(56) References Cited

U.S. PATENT DOCUMENTS

| 6,417,713 | B1 | 7/2002 | DeRyckere et al. | |
| 6,774,705 | B2 * | 8/2004 | Miyazaki et al. | 327/534 |
| 7,092,313 | B2 * | 8/2006 | Terazawa et al. | 365/233.1 |
| 2005/0094446 | A1 * | 5/2005 | Terazawa et al. | 365/200 |
| 2006/0061401 | A1 | 3/2006 | Shiratake et al. | |

FOREIGN PATENT DOCUMENTS

WO 2005008777 A1 4/2007

* cited by examiner

*Primary Examiner*—Lincoln Donovan
*Assistant Examiner*—Ryan C Jager
(74) *Attorney, Agent, or Firm*—Daniel D. Hill; Ranjeev Singh

(57) ABSTRACT

An integrated circuit including a first circuit block having a power supply terminal for receiving a first power supply voltage and an output terminal for providing a first data signal is provided. The integrated circuit further includes a second circuit block having a power supply voltage terminal for receiving a second power supply voltage and an input terminal coupled to the output terminal of the first circuit block for receiving the first data signal. The integrated circuit further includes a first programmable delay block for adding a first delay time to the first data signal when one or both of the first or second power supply voltages is changed.

19 Claims, 3 Drawing Sheets

United States Patent US 7,737,740 B2

INTEGRATED CIRCUIT WITH A PROGRAMMABLE DELAY AND A METHOD THEREOF

BACKGROUND

1. Field

This disclosure relates generally to integrated circuits, and more specifically, to an integrated circuit with a programmable delay and a method thereof.

2. Related Art

Typically, an integrated circuit may have several circuit blocks that may communicate with each other synchronously. Some circuit blocks may require a constant power, whereas other circuit blocks could function at a lower power and thus reduce overall power consumption associated with the integrated circuit. Thus, the integrated circuit may be architected, such that a group of circuit blocks have a constant voltage and another group of circuit blocks can operate at a reduced or a higher voltage using dynamic voltage and frequency scaling (DVFS) techniques, for example. When a circuit block that supports DVFS communicates with a circuit block that does not support DVFS, a large clock skew may develop across the interface between the two blocks. This large clock skew may result in the violation of setup and hold time requirements associated with sequential elements of the circuit blocks. In addition to clock skew, data path delay shifts due to DVFS may exacerbate the potential for hold time failures for timing paths which cross blocks.

Additionally, when all of the circuit blocks of an integrated circuit are operated at a reduced voltage or a higher voltage increased clock skews can be introduced. Accordingly, there is a need for an integrated circuit with programmable delay and a method thereof.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
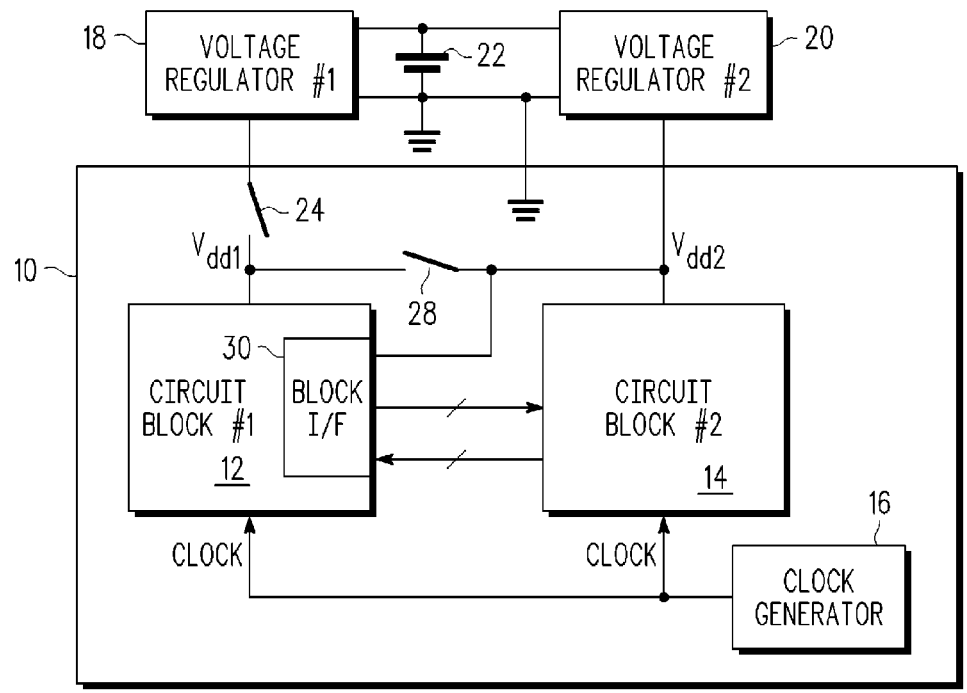
FIG. 1 is a block diagram of an integrated circuit with two exemplary circuit blocks.

In one aspect, an integrated circuit including a first circuit block having a power supply terminal for receiving a first power supply voltage, and an output terminal for providing a first data signal is provided. The integrated circuit further includes a second circuit block having a power supply voltage terminal for receiving a second power supply voltage, and an input terminal coupled to the output terminal of the first circuit block for receiving the first data signal. The integrated circuit further includes a first programmable delay block for adding a first delay time to the first data signal when one or both of the first or second power supply voltages is changed.

In another aspect, an integrated circuit including a first circuit block having a power supply terminal for receiving a first power supply voltage, an output terminal for providing a first data signal, and an input terminal is provided. The integrated circuit further includes a second circuit block having a power supply terminal for receiving a second power supply voltage, an input terminal coupled to the output terminal of the first circuit block for receiving the first data signal, and an output terminal for providing a second data signal to the input terminal of the first circuit block. The integrated circuit further includes a first switch coupled between the power supply terminals of the first and second circuit blocks, wherein the first switch opens and decouples the power supply terminals in response to an asserted alternate power mode control signal. The integrated circuit further includes a first programmable delay block for adding a first delay time to the first data signal in response to the asserted alternate power mode control signal, and the first programmable delay block for removing the first delay time from the first data signal in response to a de-asserted alternate power mode control signal.

In yet another aspect, a method for reducing timing effects due to signal skew between the first and second circuit blocks is provided. The method includes coupling a first power supply voltage to the first and second circuit blocks and receiving a request to enter an alternate power mode. The method further includes changing a clock frequency to at least one of the first and second circuit blocks. The method further includes asserting a delay enable signal for delaying the synchronous communication signals between the first and second circuit blocks. The method further includes decoupling the first power supply voltage from the first circuit block. The method further includes coupling a second power supply voltage to the first circuit block. The method further includes changing the voltage of at least one of the first and second power supply to produce a changed power supply.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 is a block diagram of an integrated circuit 10 with two exemplary circuit blocks: circuit block #1 12 and circuit block #2 14. Clock generator 16 may provide a clock signal to circuit block#1 12 and circuit block#2 14. By using the clock signal, circuit block #1 12 and circuit block #2 14 may communicate with each other synchronously. In one embodiment, clock signal provided to circuit block#1 and circuit block#2 may have the same frequency. Alternatively, one of the circuit blocks may operate at a frequency which is an integer multiple of the frequency of the clock signal coupled to the other circuit block. Circuit block #1 12 and circuit block #2 14 may communicate via block interface (I/F) module 30. Voltage regulator#1 18 and voltage regulator#2 20 may be coupled to a battery 22. Voltage regulator#1 18 may generate a voltage coupled to voltage terminal Vdd1 and voltage regulator#2 20 may generate a voltage coupled to voltage terminal Vdd2. Voltage terminal Vdd1 may be used to supply a voltage to circuit block#1 12 and Voltage terminal Vdd2 may be used to supply voltage to circuit block#2 14. Voltage regulator#1 18 and voltage regulator#2 20 may be selectively coupled or decoupled using switch 28. Although not shown, switch 28 may be controlled using an appropriate control signal. Voltage regulator#1 18 may be coupled to circuit block#1 12 via switch 24. Although not shown, switch 24 may be controlled using an appropriate control signal. Voltage terminal Vdd2 may also be coupled to block I/F 30. In one mode of operation, when switch 28 is opened, circuit block #1 12 and circuit block #2 14 may be supplied different voltages via voltage regulator#1 18 and voltage regulator#2 20, respectively. Alternately, when switch 28 is closed, circuit block #1 12 and circuit block #2 14 may be supplied the same amount of voltage via voltage regulator#1 18 and/or voltage regulator#2 20. In this instance, the output of one of the voltage regulators may be put into a high impedance state. Circuit block #1 12 and circuit block #2 14 may thus operate at different voltages from each other. Although FIG. 1 shows only two circuit blocks, integrated circuit 10 may include additional circuit blocks. In addition, any number of circuit blocks may be coupled to one voltage regulator or the other. Although not shown, clock tree buffering logic exists in blocks 12 and 14. This buffering logic can introduce large clock skews when different voltage amounts are coupled to voltage terminals Vdd1 and Vdd2. In addition, even when the two blocks are coupled to the same voltage, clock skews can increase, when the voltage level is changed from the nominal level. Although FIG. 1 shows switch 28 for coupling voltage regulator#1 18 and voltage regulator#2 20, the voltage regulators need not be coupled and thus could be implemented as permanently decoupled. This would eliminate the need for switch 28.

Figure 2:
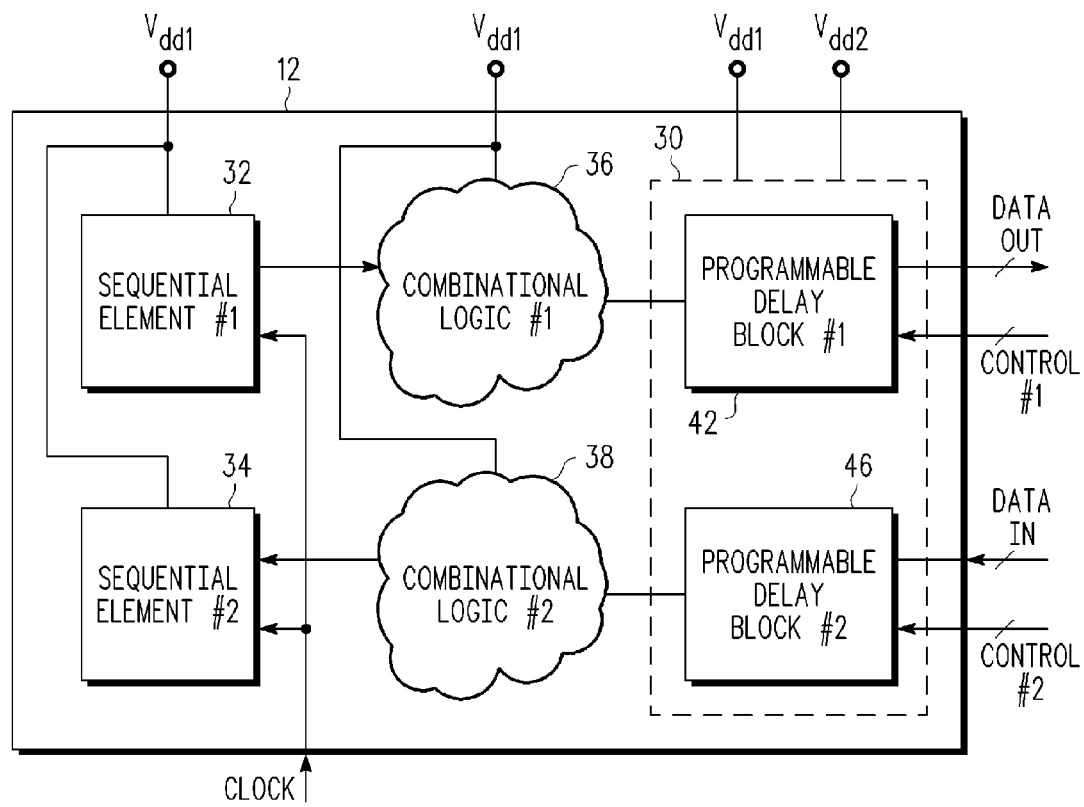
FIG. 2 is a block diagram of an exemplary circuit block of the integrated circuit of FIG. 1, including programmable delay blocks.

FIG. 2 is a block diagram of an exemplary circuit block of the integrated circuit of FIG. 1, including programmable delay blocks. By way of example, FIG. 2 shows elements of circuit block#1 12. Circuit block#1 12 may include sequential element#1 32, sequential element#2 34, combinational logic#1 36, combinational logic#2 38, and block interface 30. Combinational logic could be a single logic gate, multiple logic gates, a programmable logic array, or a conductor. Voltage terminal Vdd1 may be coupled to sequential element#1 32, sequential element#2 34, combinational logic#1 36, combinational logic#2 38, and block interface 30. Voltage terminal Vdd2 may be coupled to block interface 30. Block interface 30 may include programmable delay block#1 42 and programmable delay block#2 46. Incoming data to circuit block#1 12 may be input via terminal DATA IN. Outgoing data from circuit block#1 12 may be output via terminal DATA OUT. Control information may be communicated to programmable delay circuit block#1 42 via terminal CONTROL#1 and control information may be communicated to programmable delay circuit block#2 46 via terminal CONTROL#2. Control information may be used to control the amount of delay, if any, coupled in the outgoing and the incoming data paths. By way of example, during a normal operating mode, when the power supply voltages coupled to both Vdd1 and Vdd2 are substantially equal, no delay may be introduced into the outgoing and the incoming data paths. Alternatively, during an alternate power mode, when the power supply voltages coupled to Vdd1 and Vdd2 are unequal, a programmable amount of delay may be introduced into the outgoing and the incoming data paths. In one embodiment, the alternate power mode may be a reduced power mode. In addition, although FIG. 2 does not show any level shifters, data signals and control signals may be level shifted, as needed. Such level shifters and other logic in the programmable delay blocks may be powered using a voltage coupled to voltage terminal Vdd1 and/or a voltage coupled to voltage terminal Vdd2. By introducing delay in the incoming and outgoing data paths, hold time failures, resulting from clock skew introduced by changed voltage levels, can be avoided.

Figure 3:
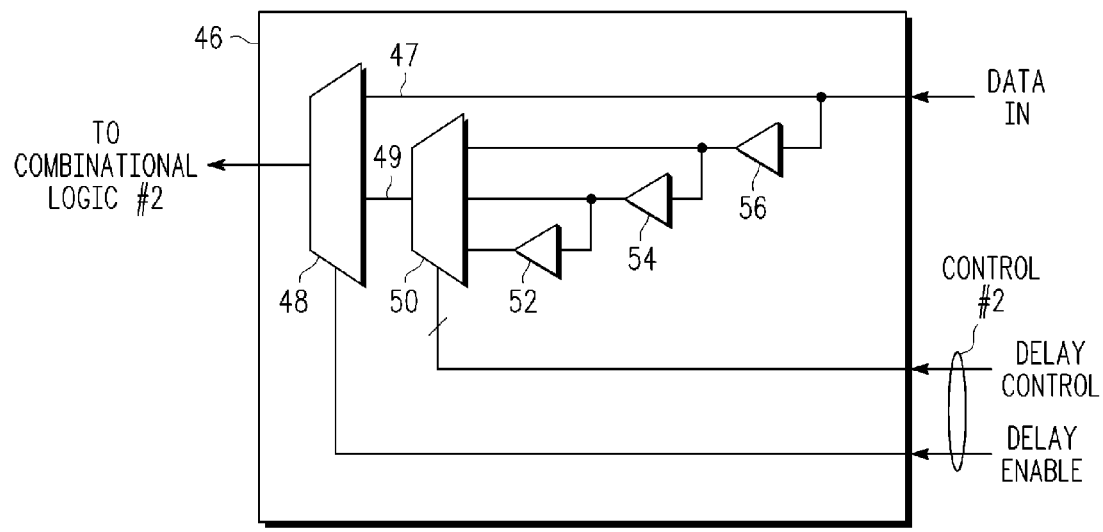
FIG. 3 is a block diagram of a programmable delay block of FIG. 2.

FIG. 3 is a block diagram of programmable delay block# 2 46 of FIG. 2. As shown with respect to FIG. 2, programmable delay block#2 46 may be used to introduce delay into the incoming data path, where the incoming data is received via terminal DATA IN. Programmable delay block#2 46 may output data to combinational logic#2 38. Programmable delay block#2 46 may include a multiplexer 48 that may be used to select a non-delayed version 47 of incoming data or a delayed version 49 of incoming data based on the status of the signal coupled to the terminal DELAY ENABLE. In particular, when the signal coupled to the terminal DELAY ENABLE is asserted, multiplexer 48 may output a delayed version of the incoming data. Alternately, when the signal coupled to the terminal DELAY ENABLE is de-asserted, multiplexer 48 may output a non-delayed version of the incoming data. Programmable delay block#2 46 may include another multiplexer 50, which may be used to introduce a programmed amount of delay into the incoming data path. By way of example, multiplexer 50 may have three data inputs; one input may have three delay elements 52, 54, 56. The second input may have two delay elements 54 and 56. The third input may have only one delay element 56. Although delay elements 52, 54, and 56 are shown as buffers, they may be implemented using other elements, such as other logic elements. Indeed, any of the delay elements may just be a wire. Control signals coupled to terminal DELAY CONTROL may determine which one of the three inputs is coupled to the output of multiplexer 50. Control signals may be generated via a control circuit located on integrated circuit 10 and may be part of circuit block#1 12. Alternatively, the control signals may be generated via a control circuit located outside integrated circuit 10. Although FIG. 3 shows the ability to select any of the three possible delays, in one embodiment, there may be only one possible delay. Thus, pursuant to an assertion of a signal coupled to the terminal DELAY ENABLE, a pre-determined delay may be introduced into the incoming data path without the need for any DELAY CONTROL signals. Additionally, although FIG. 3 shows three possible delays, any number of delay selections greater than zero could be implemented. Consistent with the embodiments, described herein, DELAY ENABLE signal may be asserted or de-asserted without stopping the clock. Furthermore, although FIG. 3 shows a specific implementation in which delay elements are cascaded in a serial fashion, delay elements may be arranged in parallel. Delay elements 52, 54, and 56 may be arranged in any combination to introduce a programmable amount of delay.

Figure 4:
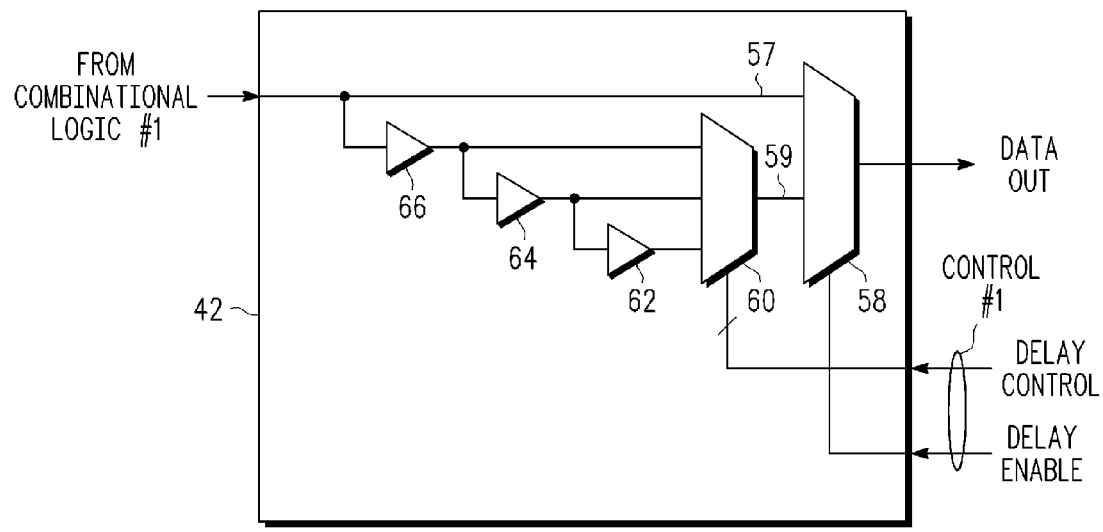
FIG. 4 is a block diagram of another programmable delay block of FIG. 2.

FIG. 4 is a block diagram of programmable delay block#1 42 of FIG. 2. As shown with respect to FIG. 2, programmable delay block#1 42 may be used to introduce delay into the outgoing data path, where the outgoing data is output via terminal DATA OUT. Programmable delay block#1 42 may receive data from combinational logic#1 36. Programmable delay block#1 42 may include a multiplexer 58 that may be used to select a non-delayed version 57 of outgoing data or a delayed version 59 of outgoing data based on the status of the signal coupled to the terminal DELAY ENABLE. In particular, when the signal coupled to the terminal DELAY ENABLE is asserted, multiplexer 58 may output a delayed version of the outgoing data. Alternately, when the signal coupled to the terminal DELAY ENABLE is de-asserted, multiplexer 58 may output a non-delayed version of the outgoing data. Programmable delay block#1 42 may include another multiplexer 60, which may be used to introduce a programmed amount of delay into the outgoing data path. By way of example, multiplexer 60 may have three data inputs; one input may have three delay elements 62, 64, 66. The second input may have two delay elements 64 and 66. The third input may have only one delay element 66. Although delay elements 62, 64, and 66 are shown as buffers, they may be implemented using other elements, such as other logic elements. Indeed, any of the delay elements may just be a wire. Control signals coupled to terminal DELAY CONTROL may determine which one of the three inputs is coupled to the output of multiplexer 60. Control signals may be generated via a control circuit located on integrated circuit 10 and may be part of circuit block#1 12. Alternatively, the control signals may be generated via a control circuit located outside integrated circuit 10. Although FIG. 4 shows the ability to select any of the three possible delays, in one embodiment, there may be only one possible delay. Thus, pursuant to an assertion of a signal coupled to the terminal DELAY ENABLE, a pre-determined delay may be introduced into the incoming data path without the need for any DELAY CONTROL signals. Additionally, although FIG. 4 shows three possible delays, any number of delay selections greater than zero could be implemented. Consistent with the embodiments, described herein, DELAY ENABLE signal may be asserted or de-asserted without stopping the clock. The delay elements shown in FIGS. 3 and 4 need not have the same amount of delay. Furthermore, although FIG. 4 shows a specific implementation in which delay elements are cascaded in a serial fashion, delay elements may be arranged in parallel. Delay elements 62, 64, and 66 may be arranged in any combination to introduce a programmable amount of delay.

Figure 5:
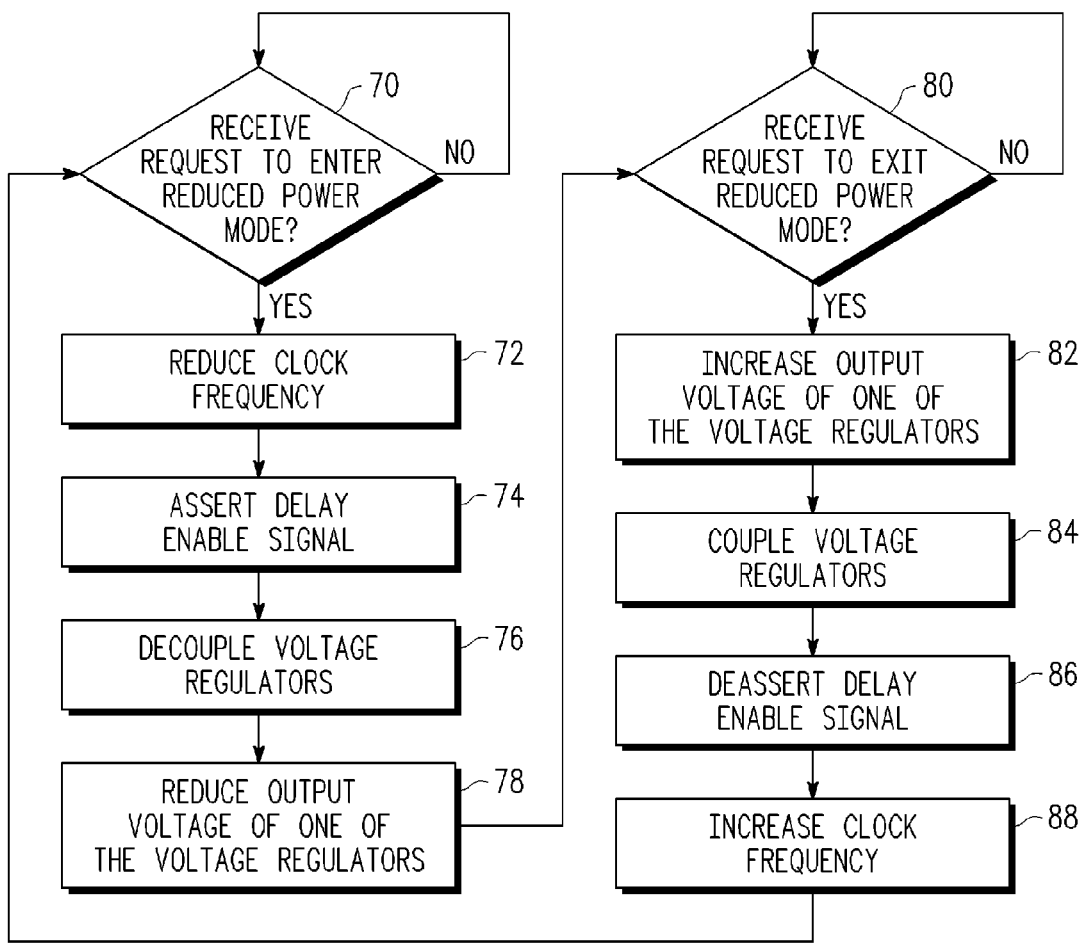
FIG. 5 is a flow chart of a method for introducing a programmable delay in a data path.

FIG. 5 is a flow chart of a method for introducing a programmable delay in a data path. For example, using this method programmable delay may be introduced into incoming data (DATA IN) and outgoing data (DATA OUT), as described above with respect to FIGS. 3 and 4. Although the embodiments described above for introducing programmable delay may be used in different environments, FIG. 5 shows one example of a method for introducing a programmable delay in a data path when a circuit block located on an integrated circuit enters into an alternate power mode, for example, a reduced power mode to conserve power. In particular, when a circuit block, for example, circuit block#1 12 receives a request to enter into a reduced power mode (step 70), first the clock frequency of the clock being used to clock circuit block#1 12 may be reduced (step 72). Next, delay enable signals coupled to, for example, the DELAY ENABLE terminals, may be asserted (step 74). This would, as described above, with respect to FIGS. 3 and 4, introduce appropriate delays, based on the control signals coupled to the DELAY CONTROL terminals, into the incoming and outgoing data paths. Next, the voltage regulators, for example, voltage regulator#1 18 and voltage regulator#2 20 may be decoupled, as described with respect to FIG. 1. In this instance, switch 24 would be closed, but switch 28 would be opened, such that voltage regulator #1 18 is coupled to circuit block#1 12 and voltage regulator #2 20 is coupled to circuit block#2 14. Next, the output voltage of one of the voltage regulators may be reduced (step 78). In particular, in this way, one circuit block may be operated at the nominal voltage, whereas another circuit block may be operated at a reduced voltage. Although this method is described with reference to reducing the output voltage of one of the voltage regulators, the output voltage of both voltage regulators may be reduced. In other embodiments, the output voltage of one or both voltage regulators may be increased.

Still referring to FIG. 5, when a request to exit reduced power mode is received (step 80), the output voltage of one of the voltage regulators may be increased (step 82). By way of example, the output voltage of voltage regulator#1 18 may be increased. Next, the voltage regulators, for example, voltage regulator#1 18 and voltage regulator#2 20 may be coupled (step 84), as described with respect to FIG. 1. In this instance, switch 24 would be opened, but switch 28 would be closed, such that voltage regulator #2 20 is coupled to both circuit block#1 12 and circuit block#2 14. Next, delay enable signals coupled to, for example, DELAY ENABLE terminals, may be de-asserted (step 86). This would, as described above, with respect to FIGS. 3 and 4, remove the delay from the incoming and outgoing data paths. Next, the clock frequency of the clock being used to clock, circuit block#1 12, for example, may be increased (step 88). Although FIG. 5 describes the method with respect to an entry into a reduced power mode and an exit from the reduced power mode, the steps corresponding to this method may be performed in other situations, as well. For example, two or more different voltages may be coupled to two or more circuit blocks, requiring programmable delay. Although the method shown in FIG. 5 discusses decoupling and coupling voltage regulators, these steps may not be required where the two voltage regulators are permanently decoupled.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
   a first circuit block having a power supply terminal for receiving a first power supply voltage and an output terminal for providing a first data signal;
   a second circuit block having a power supply voltage terminal for receiving a second power supply voltage and an input terminal; and
   a first programmable delay block having an input terminal coupled to the output terminal of the first circuit block, a control terminal for receiving a control signal, and an output terminal coupled to the input of the second circuit block, the first programmable delay block for receiving the first data signal, and for adding a first delay time to the first data signal in response to the control signal being asserted when one or both of the first or second power supply voltages is changed and the first power supply voltage is different than the second power supply voltage, and wherein the first and second power supplies are not ground.

2. The integrated circuit of claim 1, wherein the first delay time is added to the first data signal when one or both of the first power supply voltage and the second power supply voltage is changed such that the first power supply voltage is less than the second power supply voltage.

3. The integrated circuit of claim 1, wherein the first delay time is added to the first data signal when one or both of first power supply voltage and the second power supply voltage is changed such that the second power supply voltage is less than the first power supply voltage.

4. The integrated circuit of claim 1, wherein the first delay time is added to the first data signal when one or both of the first power supply voltage and the second power supply voltage is changed such that the second power supply voltage is substantially equal to the first power supply voltage.

5. The integrated circuit of claim 1, wherein the first circuit block further comprises an input terminal for receiving a second data signal from an output terminal of the second circuit block, and the integrated circuit further comprising a second programmable delay block, coupled between the first circuit block and the second circuit block for adding a second delay time to the second data signal when one or both of the first or second power supply voltages is changed.

6. The integrated circuit of claim 1, wherein the first programmable delay block comprises:
   a first multiplexer having a first input, a second input, an output, and a control terminal;
   a second multiplexer having an output coupled to the second input of the first multiplexer, first and second inputs, and a control terminal, wherein the first multiplexer and the second multiplexer are arranged to delay the first data signal by a programmable amount.

7. The integrated circuit of claim 1, wherein the first circuit block further comprises a clock terminal for receiving a clock signal at a first clock frequency and wherein the second circuit block further comprises a clock terminal for receiving a clock signal at a second clock frequency, and when the one or both of the first or second power supply voltages is changed, one of both of the first clock frequency or the second clock frequency is changed.

8. The integrated circuit of claim 1, wherein during a reduced voltage operating mode, the first power supply voltage is provided by a first power supply regulator and the second power supply voltage is provided by a second power supply regulator, the second power supply voltage being lower than the first power supply voltage.

9. The integrated circuit of claim 1, further comprising a switch having a first terminal coupled to the power supply terminal of the first circuit block, a second terminal coupled to the power supply terminal of the second circuit block, and a control terminal for receiving a control signal.

10. An integrated circuit comprising:
    a first circuit block having a power supply terminal for receiving a first power supply voltage, an input terminal, a clock terminal for receiving a clock signal at a first clock frequency, and an output terminal for providing a first data signal;
    a second circuit block having a power supply terminal for receiving a second power supply voltage, an input terminal coupled to the output terminal of the first circuit block for receiving the first data signal, a clock terminal for receiving a clock signal at a second clock frequency, and an output terminal for providing a second data signal to the input terminal of the first circuit block;

a first switch coupled between the power supply terminals of the first and second circuit blocks, wherein the first switch opens and decouples the power supply terminals in response to an asserted alternate power mode control signal; and a first programmable delay block for adding a first delay time to the first data signal in response to the asserted alternate power mode control signal, and the first programmable delay block for removing the first delay time from the first data signal in response to a de-asserted alternate power mode control signal, and wherein one or both of the first clock frequency or the second clock frequency is changed in response to the asserted alternate power mode control signal.

11. The integrated circuit of claim 10, further comprising a second programmable delay block for adding a second delay time to the second data signal in response to the asserted alternate power mode control signal, and the second programmable delay block for removing the second delay time from the second data signal in response to a de-asserted alternate power mode control signal.

12. The integrated circuit of claim 10, further comprising a second switch coupled to provide the first power supply voltage to the first power supply terminal in response to the asserted alternate power mode control signal.

13. The integrated circuit of claim 10, wherein the first programmable delay block comprises:
   a first multiplexer having a first input, a second input, an output, and a control terminal;
   a second multiplexer having an output coupled to the second input of the first multiplexer, first and second inputs, and a control terminal for receiving a first control signal;
   a first delay element having a first terminal coupled to the first input of the first multiplexer, and a second terminal coupled to the first input of the second multiplexer; and
   a second delay element having a first terminal coupled to the second terminal of the first delay element, and a second terminal coupled to the second input terminal of the second multiplexer.

14. In a data processing system having a first circuit block for synchronously communicating with a second circuit block, a method for reducing timing effects due to signal skew between the first and second circuit blocks, the method comprising:
   coupling a first power supply voltage to the first and second circuit blocks;
   receiving a request to enter an alternate power mode;
   changing a clock frequency to at least one of the first and second circuit blocks;
   asserting a delay enable signal for delaying the synchronous communication signals between the first and second circuit blocks;
   decoupling the first power supply voltage from the first circuit block;
   coupling a second power supply voltage to the first circuit block; and
   changing the voltage of at least one of the first and second power supply to produce a changed power supply.

15. The method of claim 14, further comprising:
   receiving a request to exit the alternate power mode;
   changing the voltage of the changed power supply;
   coupling the first power supply voltage to the first and second circuit blocks;
   de-asserting the delay enable signal for removing the delay from the synchronous communication signals between the first and second circuit blocks; and
   changing the clock frequency to at least one of the first or second circuit blocks.

16. The method of claim 14, wherein coupling a first power supply voltage to the first and second circuit blocks further comprises providing a switch between first and second power supply voltage terminals.

17. The method of claim 14, wherein asserting a delay enable signal further comprises adding a selectable number of delay elements into the synchronous communication signals.

18. The method of claim 14, wherein the data processing system is at least a portion of a battery powered device.

19. The method of claim 14, wherein the method is implemented on a single integrated circuit.

* * * * *